United States Patent [19]
Buck et al.

[11] Patent Number: 4,748,740
[45] Date of Patent: Jun. 7, 1988

[54] AUTOMATIC COMPONENT MOUNTING MACHINE

[76] Inventors: Robert Buck, Vogelherdbogen 67, 7992 Tettnang; Gerd Marhofer, Beckmannsbusch 67, 4300 Essen 1, both of Fed. Rep. of Germany

[21] Appl. No.: 822,299

[22] Filed: Jan. 24, 1986

[30] Foreign Application Priority Data

Jan. 24, 1985 [DE] Fed. Rep. of Germany ....... 3502257

[51] Int. Cl.⁴ .............................................. B23P 19/04
[52] U.S. Cl. ....................................... 29/740; 29/739; 29/809; 198/586
[58] Field of Search ................ 29/740, 809, 741, 739, 29/822; 221/72–74, 120; 198/586; 209/573, 706; 74/665 GE; 474/73; 901/7

[56] References Cited

FOREIGN PATENT DOCUMENTS 3424323 1/1985 Fed. Rep. of Germany ........ 29/740

OTHER PUBLICATIONS

SIEMENS, "Bestückautomat für Chip und Planare Bauelemente", May, 1983.

Primary Examiner—P. W. Echols
Attorney, Agent, or Firm—Browdy & Neimark

[57] ABSTRACT

An automatic machine for mounting leadless components such as chip components onto a substrate. The components are delivered on belts wound onto belt reels having a substrate holder operating as a feed device in the longitudinal direction. The machine has a "pick and place" device with a positioning unit and a mounting head, as well as a component delivery device for the components on the belt reels. The component delivery device has a holder unit for the belt reels, a belt guide having a plurality of belt guide tracks, a belt conveyor and a peel-off unit for peeling off the material covering the belts. The belt conveyor is a single unit. In each individual mounting operation, a separate belt is moved into the belt conveyor position specified by the belt conveyor unit.

15 Claims, 6 Drawing Sheets

AUTOMATIC COMPONENT MOUNTING MACHINE

FIELD OF THE INVENTION

The invention relates to an automatic machine for mounting leadless components (chip components) on a substrate, the components being delivered on belts wound onto belt reels (belted components), having a substrate holder preferably operating as a feed device in the longitudinal direction (longitudinal direction=the X direction), having a "pick-and-place" device with a positioning unit and a mounting head and having a component delivery device for the belted components, wherein the component delivery apparatus has a holder unit for the belt reels, a belt guide having a plurality of belt guide tracks, a belt conveyor and a peel-off unit for peeling off the material covering the belts.

BACKGROUND OF THE INVENTION

To an increasing extent, plate-like or strip-like substrates are being assembled with leadless components, instead of wire-equipped components, as before; these leadless elements will hereinafter be called chip components. The term "chip components" refers not only to cube-shaped chip resistors and chip capacitors, but to all "leadless" components, such as all planar components, the leads of which are not "inserted" into the substrate but are instead "mounted" on it (examples are MELFS, circuits in an SO housing, a DIL housing, and so forth).

As compared with the use of wire-equipped components, the use of chip components results in greater packing density and greater reliability and in assembly techniques that are more amenable to being automated.

To mount chip components onto substrates automatically, automatic component mounting machines have meanwhile been developed, the basic structure of which comprises a substrate holder, a "pick-and-place" device including a positioning unit and a mounting head, and a component delivery device.

Chip components are supplied by component manufacturers either in bags or in belts wound up on belt reels. When chip components furnished in bags are used, the component delivery apparatus of automatic component mounting machines includes a longitudinal vibration conveyor, a round vibration conveyor or a rectangular vibration conveyor, for example. If chip components furnished in belts wound up on belt reels (known as belted components) are used, then the component delivery apparatus of automatic component mounting machines includes a holder unit for the belt reels, a belt guide having a plurality of belt guide tracks, a belt conveyor and a peel-off unit for the material covering the belt.

To define the prior art which is the point of departure for the present invention, specifically with respect to chip components, the automatic mounting of chip components onto substrates and automatic component mounting machines, reference is hereby made to the Siemens publication entitled "Bestückautomat für Chip und planare Bauelemente" ["Automatic Mounting Machine for Chip and Planar Components"], Siemens publication Mch 01710.835. The entire disclosure content of this publication is hereby expressly incorporated by reference into the disclosure content of this patent application.

In the prior art which is the point of departure for the invention (see the above-mentioned Siemens publication, in particular page 8, left-hand column; page 9, left-hand column; pages 1–16; and pages 21 ff.), the chip delivery apparatus is embodied such that a separate belt guide, a separate belt conveyor unit and a separate peel-off drive mechanism are provided for each belt reel (or each pair of belt reels). In the assembled state, the holder unit for the belt reels, the belt guides, the belt conveyor unit and the peel-off unit along with the peel-off drive mechanisms form a stationary unit.

SUMMARY OF THE INVENTION

With the aid of the automatic mounting machine known in the prior art and representing the point of departure for the invention, the mounting of chip components onto substrates takes the following course with respect to the component delivery apparatus:

The outset point of the discussion is the status of the automatic mounting machine in which all the belts are located in the position in which the mounting head of the "pick-and-place" device is capable of removing one chip component from the individual belts in succession. Once mounting has begun, the mounting head of the "pick-and-place" device continuously removes one chip component at a time from the various belts; on the substrate that is to be assembled, this component is then placed at a predetermined location. Once the mounting head of the "pick-and-place" device has removed all the chip components required for assembling one substrate from the belts and has placed them on the substrate to be assembled, then all the belts are simultaneously conveyed onward, with the aid of the belt conveyor units, by a distance such that once again all the belts are located in the position in which the mounting head of the "pick-and-place" device can remove one chip component at a time from the various belts in succession.

From the above function of the known automatic mounting machine which is the point of departure for the present invention, described with respect to the component delivery apparatus, it is clear that there is a great number of belt conveyor units, which are not nearly fully exploited. For instance, if there are 48 belts, then 48 belt conveyor units (or 24 belt conveyor units, if each belt conveyor unit is associated with a pair of belts) at a time are moved by one conveying increment. After that, the belt conveyor units are not used again until the mounting head of the "pick-and-place device" has removed the chip elements required for assembling one substrate from the belts and placed them on the substrate to be assembled.

As a result, the known component mounting machine, the point of departure for the present invention, is overly expensive in terms of component delivery apparatus, and so it is the object of the present invention to describe an automatic component mounting machine that is less expensive in terms of the component delivery apparatus.

The automatic component mounting machine in which the object derived from and explained by the above is attained is characterized initially and substantially in that the belt conveyor is embodied as a single belt conveyor unit, and that for each individual mounting operation one belt at a time is moved into the belt conveyor position specified by the belt conveyor unit. Thus while in the known component mounting machine that is a point of departure for the present invention and has for example 48 belts, 48 belt conveyor units (or 24 belt conveyor units, if one belt conveyor unit is associated with each pair of belts) must each execute one conveying increment for each substrate that is to be assembled, only one belt conveyor unit is required in an automatic component mounting machine according to the invention; this single unit then executes a conveyor increment 48 times for each substrate that is to be assembled. It will readily be appreciated that one belt conveyor unit is considerably less expensive than 48 (or even 24) belt conveyor units, even if this belt conveyor unit is embodied such that it operates particularly accurately and reliably.

DESCRIPTION OF THE DRAWINGS

The teaching of the invention, as well as embodiments and variants of the teaching of the invention, will be explained in further detail below, in terms of an exemplary embodiment shown in the drawing; shown are.

DETAILED DESCRIPTION OF THE INVENTION

Figure 1:
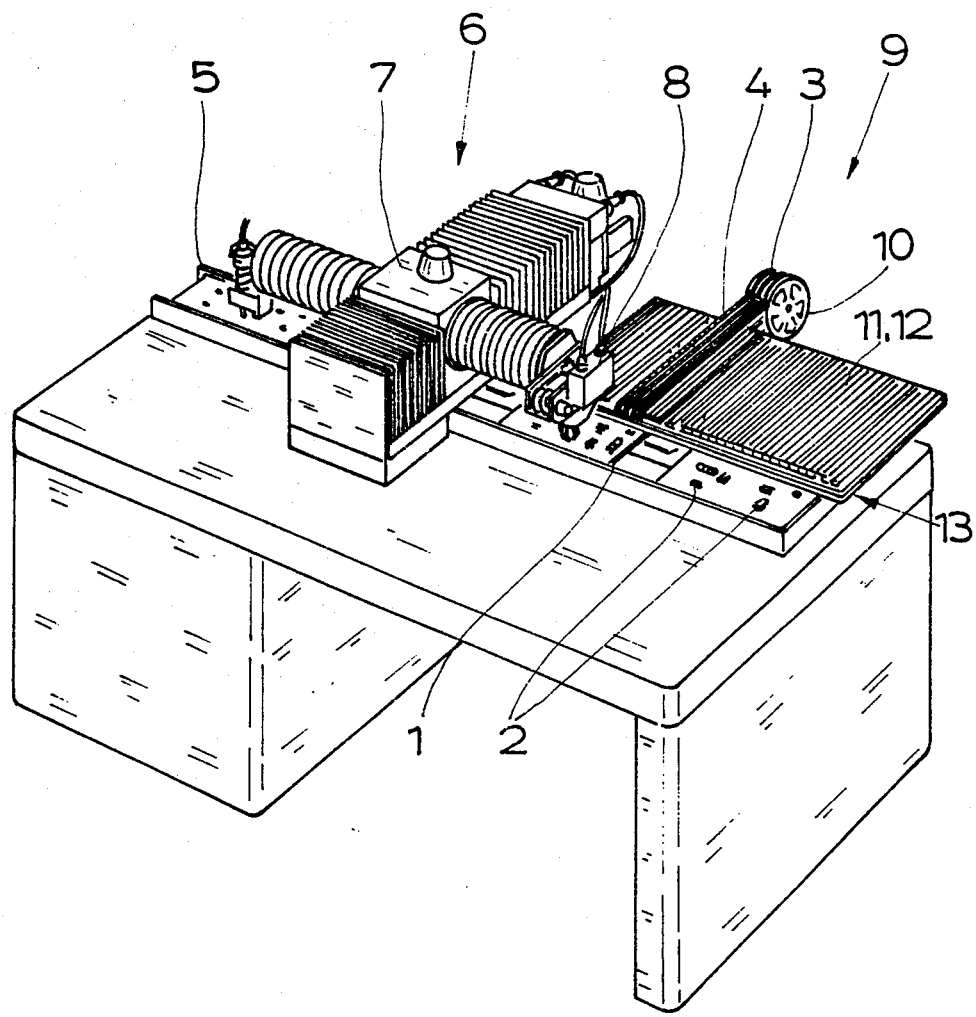
FIG. 1, a schematic perspective view of an automatic machine for mounting chip components on substrates, using belted components, FIG. 2, on a larger scale than FIG. 1, a detail of the subject of FIG. 1.

The automatic component mounting machine shown schematically in FIG. 1 is intended for assembly of substrates 1 by mounting on them chip components 2, that is, leadless components, and specifically belted components that are furnished in belts 4 wound up on belt reels 3. The automatic component mounting machine shown includes a substrate holder 5, operating as a feed device in the longitudinal direction (i.e., the X direction); a "pick-and-place" device 6 having a positioning unit 7 and a mounting head 8; and a component delivery apparatus 9. The component delivery apparatus 9 has a holder unit 10 for the belt reels 3, a belt guide 11 having a plurality of belt guide tracks 12, a belt conveyor 13 and a peel-off unit 14 for peeling off the covering material 15 of the belts 4.

Figure 3:
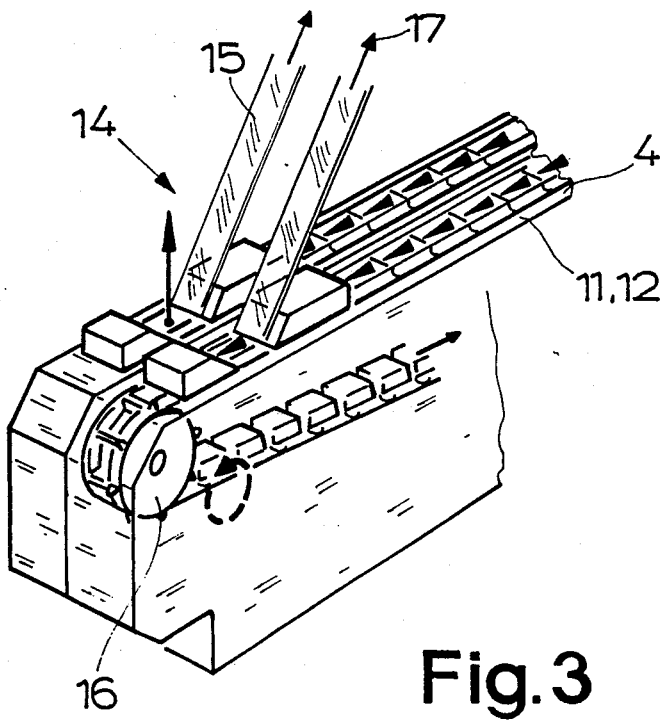
FIG. 3, a portion of a component delivery apparatus of the automatic component mounting machine that was the point of departure for the present invention.

In FIG. 3, the prior art serving as the point of departure for the invention is merely suggested. For each belt reel 3 or for each pair of belt reels 3 there is a separate belt guide 11, separate belt conveyor unit 16 and a separate peel-off drive mechanism 17. In the assembled state, the holder unit 10 for the belt reels 3, the belt guides 11, the belt conveyor units 16 and the peel-off unit 14 comprise a stationary structural unit.

Figure 2:
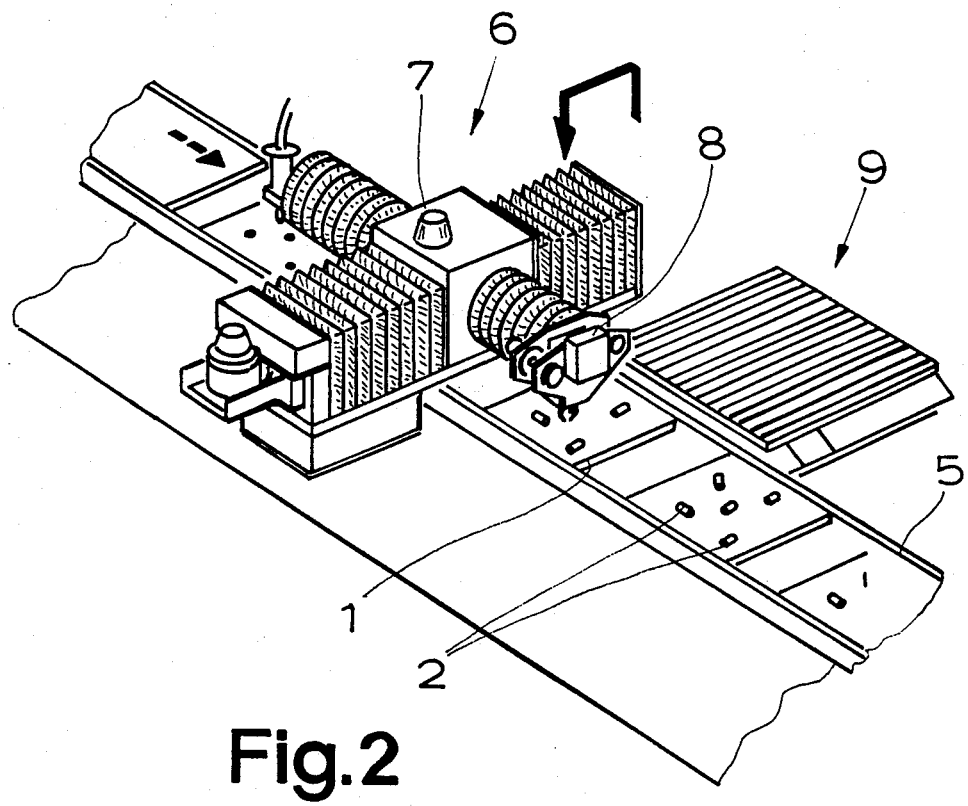

Now if FIGS. 1 and 2 are taken together and referring to FIGS. 4–8 as well, it can be seen that in the automatic component mounting machine according to the invention, the belt conveyor 13 is realized as a single belt conveyor unit 16, and for each individual substrate assembly operation one belt 4 is moved into the belt conveyor position specified by the belt conveyor unit 16. Thus while in the known automatic component mounting machine on which the invention is based, having 48 belts as an example, there are then 48 belt conveyor units 16 (or 24 belt conveyor units 16 if one belt conveyor unit 16 is associated with each pair of belts 4) for each substrate 1 that is to be assembled, all of which must execute a conveyor increment, only one belt conveyor unit 16 is required in the machine according to the invention, and this unit 16 then executes a conveyor increment 48 times for each substrate 1 that is to be assembled.

Figure 4:
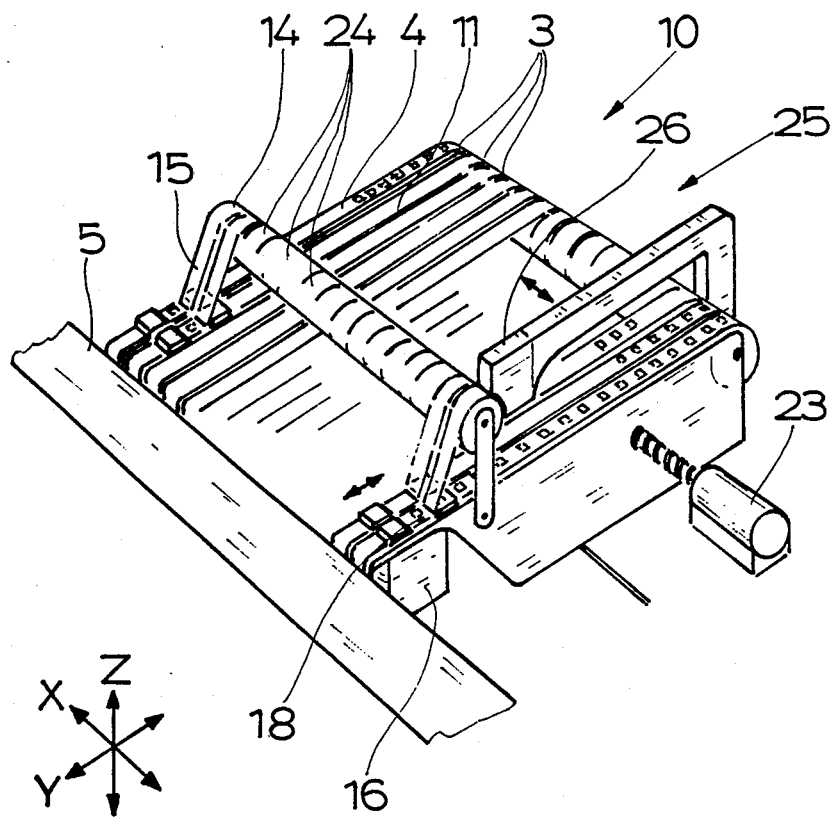
FIG. 4, a schematic perspective view of a detail of a component delivery apparatus of a preferred embodiment of an automatic component mounting machine according to the invention.
Figure 5:
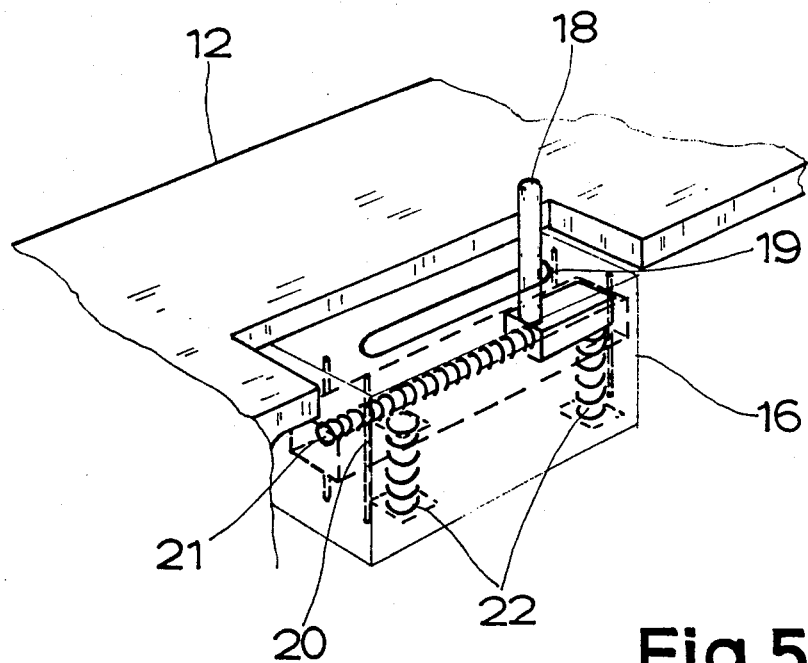
FIG. 5, on a larger scale than FIG. 4, a detail of the subject of FIG. 4.

As FIGS. 4 and 5 show, the exemplary embodiment shown here for an automatic component mounting machine is further characterized in that the belt conveyor unit 16 has a conveyor pin 18, and the conveyor pin 18 is movable in the crosswise direction (i.e., the Y direction) and in the vertical direction (i.e., the Z direction). In detail, the belt conveyor unit 16 has a Y guide 19 and a Z guide 20 for the conveyor pin 18, which are embodied as guide slits in the exemplary embodiment shown, and the conveyor pin 18 is retained in its outset position by spring loading, namely by means of a Y spring 21 and a Z spring 22, each of which is embodied as a compression spring. The conveyor pin 18 is movable with the aid of pneumatically actuatable cylinder-piston devices, not shown here. (In the known automatic component mounting machine, on which the invention is based, it is known per se to embody the belt conveyor unit 16 with a conveyor pin 18 in the above-described manner, so the arrangement need not be described in further detail here.)

As mentioned above, it is part of the essential concept of the invention that for each individual substrate assembly operation, one belt 4 at a time is moved into the belt conveyor position dictated by the belt conveyor unit 16. This can be accomplished by making the belt guide 11 movable. In the exemplary embodiment, the holder unit 10 for the belt reels 3, the belt guide 11 and the peel-off unit 14 for the material 15 covering the belts 4 are combined into a structural unit that is movable in the X direction. For moving the belt guide 11, or the structural unit comprising the holder unit 10 for the belt reels 3, the belt guide 11 and the peel-off unit 14 for the covering material 15, a spindle drive mechanism 23 is provided.

In the automatic component mounting machine according to the invention, the belts that have been emptied can be moved away in the downward direction, and a cutting device associated with the emptied belts can be provided; these features are not shown in the drawings.

Figure 6:
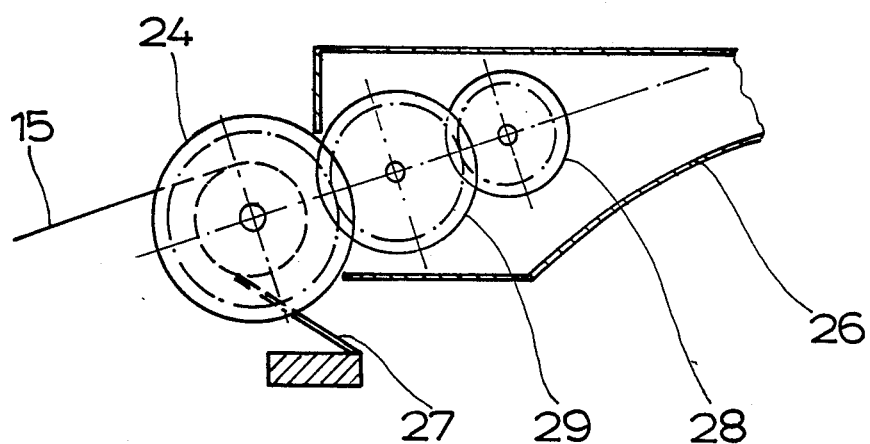
FIG. 6, a schematic view of a detail of a peel-off unit of a preferred embodiment of an automatic component mounting machine according to the invention.

The exemplary embodiment of FIG. 4 is characterized in that the peel-off unit 14 for the material 15 covering the belts 4 has a number of peel-off rollers 24 equivalent to the number of belt reels 3 and also has a peel-off drive mechanism 25. The peel-off drive mechanism 25 is embodied as a single peel-off drive unit 26, and for each individual peel-off operation one peel-off roller 24 at a time is moved into the peel-off position dictated by the peel-off drive unit 26. The principle that is realized for the belt conveyor 13 according to the invention—that is, having only a single belt conveyor unit 16—is thereby realized for the peel-off drive mechanism 25 as well. As can be seen in FIG. 6, one brake element 27 is associated with each peel-off roller 24, which is effective for braking in only the direction opposite the peel-off direction and is embodied as a leaf spring. The peel-off drive unit 26 has an electric motor 28, specifically a direct-current motor, so that by open- or closed-loop control of the armature current of the electric motor 28, the drive moment of the electric motor 28 and hence the peel-off force of the peel-off roller 24 that is coupled to the peel-off drive unit 26 can be controlled in an open- or closed-loop manner. Between the electric motor 28 and the peel-off roller 24 coupled with the peel-off drive unit 26, a torque transmission wheel 29 is provided.

Figure 7:
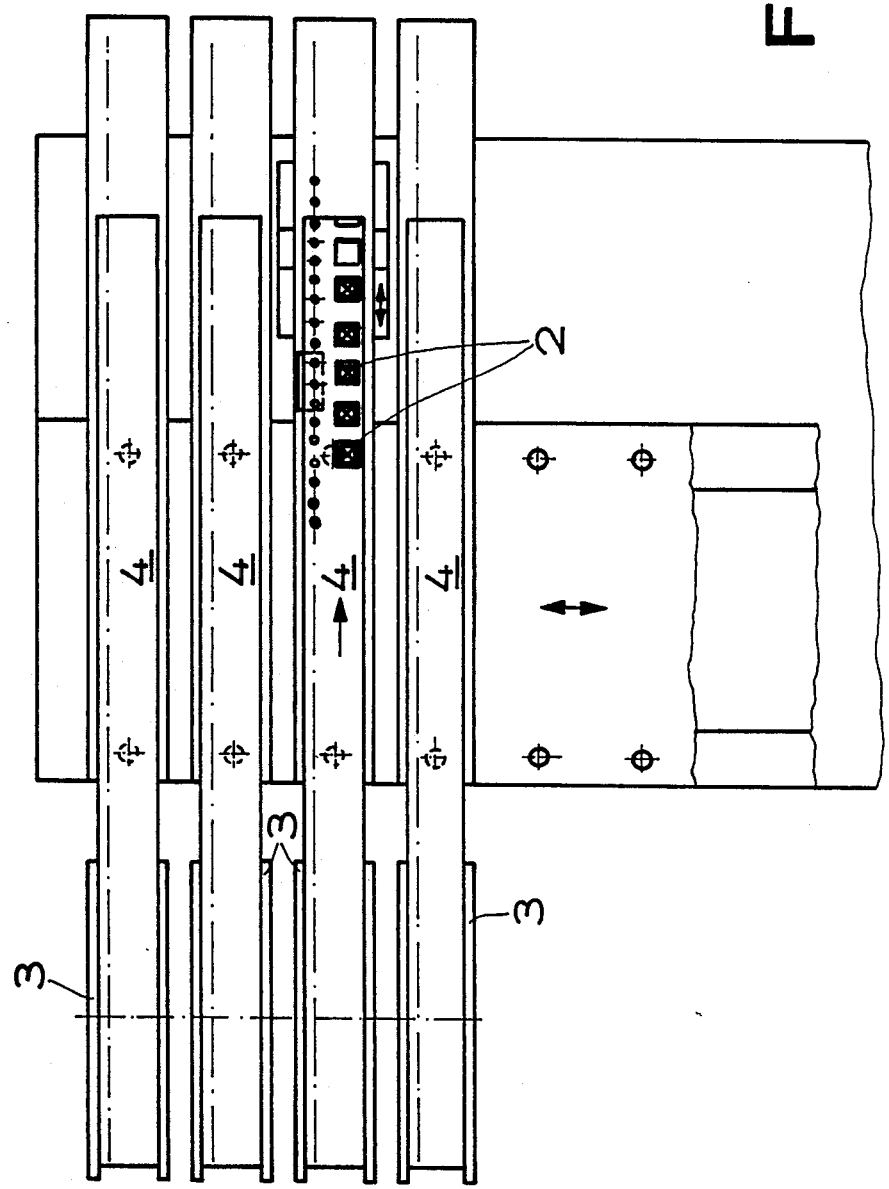
FIG. 7, a detail of another preferred embodiment of an automatic component mounting machine according to the invention, seen in plan view.
Figure 8:
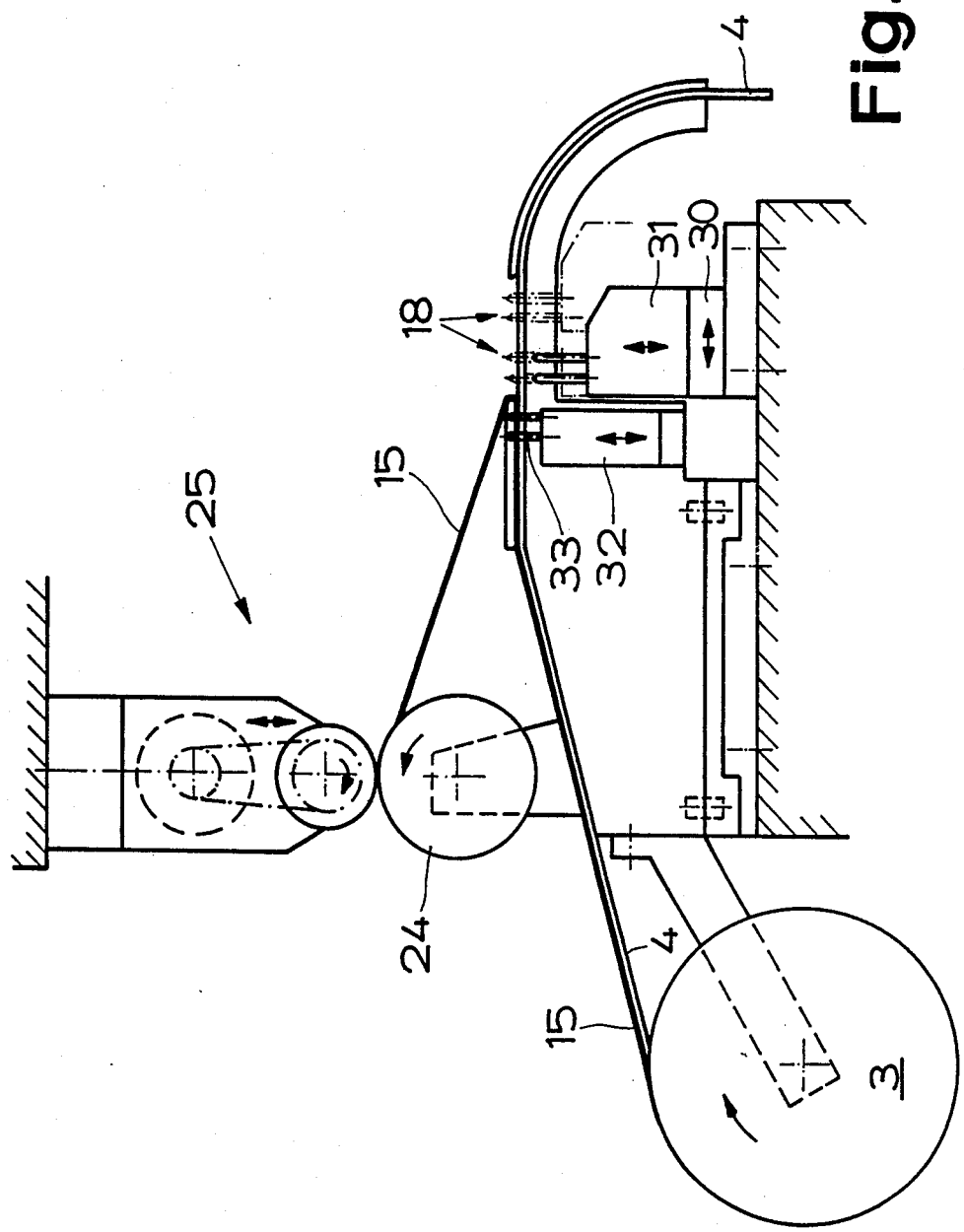
FIG. 8, a side view of the subject of FIG. 7.

The exemplary embodiment of the automatic component mounting machine according to the invention that is shown in FIGS. 7 and 8 corresponds in its essential structure to the exemplary embodiment described above.

In the exemplary embodiment of the automatic component mounting machine shown in FIGS. 7 and 8, a Y conveyor unit 30 is provided, and a Z conveyor unit 31, which includes two conveyor pins 18, is mounted on the Y conveyor unit 30. In addition, a holder unit 32 is provided, which includes two retaining pins 33. The Y conveyor unit 30 and the Z conveyor unit 31, on the one hand, and the holder unit 32 on the other operate in alternation; thus either the conveyor pins 18 or the retainer pins 33 are in engagement with a belt 4.

As in the exemplary embodiment described earlier herein, the belt conveyor unit 16 in the exemplary embodiment of an automatic component mounting machine shown in FIGS. 7 and 8 is again stationary. A single peel-off unit 14 that is also stationary is shown here as well, cooperating with a given belt 4, with which the belt conveyor unit 16 also cooperates.

We claim:

1. An automatic machine for mounting leadless components on a substrate, the components being delivered on belts wound onto belt reels, comprising
a substrate holder operating as a feed device in a first direction,
a "pick-and-place" device with a positioning unit and a mounting head and having a component delivery for the components on the belt reels,
said component delivery device including
a holder unit for the belt reels,
a belt guide having a plurality of belt guide tracks,
a belt conveyor, and
a peel-off unit for peeling off a material covering the belts,
wherein the belt conveyor is embodied as a single belt conveyor unit and for each individual mounting operation each of a respective plurality of the belts is moved into a predetermined position corresponding to a position of the belt conveyor unit, and
said holder unit, belt guide and peel-off unit are combined into a component to be integrally movable in said first direction for the movement of each said belt into said predetermined position.

2. An automatic component mounting machine as defined by claim 1, wherein the belt conveyor unit has a conveyor pin, and the conveyor pin is movable in both a second direction transverse to said first direction and in a third direction that is transverse to both said first and second directions.

3. An automatic component mounting machine as defined by claim 2, wherein the belt conveyor unit has a first guide and a second guide for guiding the conveyor pin in said second and third directions, respectively, and said first guide is embodied as a slit.

4. An automatic component mounting machine as defined by claim 3, wherein the conveyor pin is retained in its initial position by spring loading means including a first spring and a second spring.

5. An automatic component mounting machine as defined by claim 2, wherein the conveyor pin is retained in an initial position by spring loading means including a first spring and a second spring for urging said pin along said second and third directions, respectively, and the second spring and the third spring are embodied as compression springs.

6. An automatic component mounting machine as defined by claim 2 wherein the conveyor pin is movable with the aid of pneumatically actuatable cylinderpiston devices.

7. An automatic component mounting machine as defined by claim 2, wherein the belt conveyor unit has a first guide and a second guide for guiding the conveyor pin in said second and third directions, respectively.

8. An automatic component mounting machine as defined by claim 1, wherein the belt guide is movable in said first direction, and a spindle drive is provided for moving said component for the integral movement of the holder unit, the belt guide and the peel-off unit.

9. An automatic component mounting machine as defined by claim 1, wherein the peel-off unit for the covering material of the belts has a plurality of peel-off rollers, one for each said belt, and a single peel-off drive mechanism for engaging in succession each peel-off roller of the plurality of belts to be moved for each said individual mounting operation.

10. An automatic component mounting machine as defined by claim 9, wherein a respective brake element is associated with each said peel-off roller, each said brake element being effective for braking in only a direction opposite a peel-off direction, and being embodied as a leaf spring.

11. An automatic component mounting machine as defined by claim 10, wherein the peel-off drive mechanism has an electric motor.

12. An automatic component mounting machine as defined by claim 9, wherein the peel-off drive mechanism includes an electric motor.

13. An automatic component mounting machine as defined by claim 12, wherein a direct-current motor is provided as the electric motor, and with the aid of an open- or closed-loop control of the armature current of the electric motor, the drive moment of the electric motor and thus the peel-off force of the peel-off roller coupled with the peel-off drive mechanism is controlled in an open- or closed-loop manner.

14. An automatic component mounting machine as defined by claim 13, wherein at least one torque transmission wheel is provided between the electric motor and the peel-off roller.

15. An automatic component mounting machine as defined by claim 12, wherein at least one torque transmission wheel is provided between the electric motor and the peel-off roller.

* * * * *